United States Patent
Majhi et al.

(10) Patent No.: US 7,763,511 B2
(45) Date of Patent: Jul. 27, 2010

(54) DIELECTRIC BARRIER FOR NANOCRYSTALS

(75) Inventors: Prashant Majhi, Austin, TX (US); Kyu S. Min, San Jose, CA (US); Wilman Tsai, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 11/618,666

(22) Filed: Dec. 29, 2006

(65) Prior Publication Data

US 2008/0157171 A1 Jul. 3, 2008

(51) Int. Cl.
*H01L 21/00* (2006.01)
(52) U.S. Cl. .................. 438/257; 438/260; 438/710
(58) Field of Classification Search ............. 438/257, 438/260, 710
See application file for complete search history.

(56) References Cited

U.S. PATENT DOCUMENTS

| | | | |
|---|---|---|---|
| 5,714,336 A | 2/1998 | Simons et al. | |
| 5,714,766 A | 2/1998 | Chen et al. | |
| 6,060,743 A | 5/2000 | Sugiyama et al. | |
| 6,063,705 A | 5/2000 | Vaartstra | |
| 6,162,712 A | 12/2000 | Baum et al. | |
| 6,194,237 B1 | 2/2001 | Kim et al. | |
| 6,210,843 B1 | 4/2001 | Chen | |
| 6,291,341 B1 | 9/2001 | Sharan et al. | |
| 6,297,095 B1 | 10/2001 | Muralidhar et al. | |
| 6,346,477 B1 | 2/2002 | Kaloyeros et al. | |
| 6,458,495 B1 | 10/2002 | Tsai et al. | |
| 6,485,869 B2 | 11/2002 | Tsai et al. | |
| 6,590,907 B1 | 7/2003 | Jones | |
| 6,692,878 B2 | 2/2004 | Tsai et al. | |
| 6,713,329 B1 | 3/2004 | Wagner et al. | |
| 6,713,812 B1 | 3/2004 | Hoefler et al. | |
| 6,756,292 B2 | 6/2004 | Lee et al. | |
| 6,849,948 B2 | 2/2005 | Chen et al. | |
| 6,887,758 B2 | 5/2005 | Chindalore et al. | |
| 7,037,574 B2 | 5/2006 | Paranjpe et al. | |
| 7,132,329 B1 | 11/2006 | Hong et al. | |
| 7,138,336 B2 | 11/2006 | Lee et al. | |
| 7,208,366 B2 | 4/2007 | Tsai | |
| 7,223,701 B2 | 5/2007 | Min | |
| 7,501,315 B2* | 3/2009 | Heald et al. .................. 438/128 |
| 2001/0012698 A1 | 8/2001 | Hayashi et al. | |
| 2002/0000593 A1 | 1/2002 | Nishiyama et al. | |
| 2002/0013052 A1 | 1/2002 | Visokay | |
| 2002/0197793 A1 | 12/2002 | Dornfest et al. | |

(Continued)

OTHER PUBLICATIONS

Hanafi, H., et al., "Fast and Long Retention-Time Nano-Crystal Memory", *IEEE Trans. on Electron Devices*, 43, (Sep. 1996),1553-1558.

(Continued)

*Primary Examiner*—Laura M Menz
(74) *Attorney, Agent, or Firm*—Schwegman, Lundberg & Woessner, P.A.

(57) ABSTRACT

Electronic apparatus, systems, and methods of forming such electronic apparatus and systems include non-insulating nanocrystals disposed on a dielectric stack, where the non-insulating nanocrystals are arranged to store electric charge. The dielectric stack includes two dielectric layers having different electron barriers such that the non-insulating nanocrystals may be disposed on the dielectric layer having the lower electron barrier.

21 Claims, 4 Drawing Sheets

U.S. PATENT DOCUMENTS

| | | |
|---|---|---|
| 2003/0001190 A1 | 1/2003 | Basceri et al. |
| 2003/0143801 A1 | 7/2003 | Basceri et al. |
| 2003/0235064 A1 | 12/2003 | Batra et al. |
| 2004/0048485 A1 | 3/2004 | Min et al. |
| 2004/0086897 A1 | 5/2004 | Mirkin et al. |
| 2004/0107906 A1 | 6/2004 | Collins et al. |
| 2004/0206957 A1 | 10/2004 | Inoue et al. |
| 2004/0212025 A1 | 10/2004 | Tsai |
| 2005/0012164 A1 | 1/2005 | Tsai |
| 2005/0032269 A1 | 2/2005 | Xu et al. |
| 2005/0040034 A1 | 2/2005 | Landgraf et al. |
| 2005/0151261 A1 | 7/2005 | Kellar et al. |
| 2005/0287717 A1* | 12/2005 | Heald et al. .................. 438/128 |
| 2006/0046383 A1 | 3/2006 | Chen et al. |
| 2006/0046384 A1 | 3/2006 | Joo et al. |
| 2006/0068540 A1 | 3/2006 | Min et al. |
| 2006/0098524 A1 | 5/2006 | Xu et al. |
| 2006/0105523 A1 | 5/2006 | Afzali-Ardakani et al. |
| 2006/0110883 A1 | 5/2006 | Min |
| 2006/0118853 A1 | 6/2006 | Takata et al. |
| 2006/0194438 A1 | 8/2006 | Rao et al. |
| 2006/0231889 A1 | 10/2006 | Chen et al. |
| 2006/0252202 A1 | 11/2006 | Dai et al. |
| 2007/0018342 A1* | 1/2007 | Sandhu et al. ........ 257/E29.071 |
| 2007/0032091 A1* | 2/2007 | Heald et al. .................. 438/758 |
| 2007/0092989 A1 | 4/2007 | Kraus et al. |
| 2007/0228513 A1 | 10/2007 | Min |
| 2007/0284613 A1 | 12/2007 | Chui |
| 2008/0157171 A1* | 7/2008 | Majhi et al. .................. 257/321 |
| 2009/0065764 A1* | 3/2009 | Heald et al. .................... 257/14 |

OTHER PUBLICATIONS

Krivokapic, Z , et al., "Quantum-well memory device (QWMD) with extremely good charge retention", *International Electron Devices Meeting, 2002. IEDM '02 Digest.*, (2002),185-188.

Lee, C , et al., "Investigation on Process Dependence of Self-Assembled Metal Nanocrystals", *MRS Symposium*, vol. 737, Symposium Title: Nanocrystalline Semiconductor Materials and Devices,(2002),F8.18.6.

Liu, Z. , "Metal nanocrystal memories-part II: electrical characteristics", *IEEE Transactions on Electron Devices*, 49(9), (2002),1614-1622.

Liu, Zengtao , et al., "Metal nanocrystal memories. I. Device design and fabrication", *IEEE Transactions on Electron Devices*, 49(9), (Sep. 2002),1606-1613.

Ohba, R. , et al., "Non-volatile Si quantum memory with self-aligned doubly-stacked dots", *IEDM Technical Digest. International Electron Devices Meeting*, (Dec. 10-13, 2000),313-316.

Shi, Y. , et al., "Effects of traps on charge storage characteristics in metal-oxide-semiconductor memory structures based on silicon nanocrystals", *J. Appl. Phys.*, 84, (1998),2358-2360.

Tiwari, Sandip , et al., "Volatile and non-volatile memories in silicon with nano-crystal storage", *International Electron Devices Meeting, IEEE*, (Dec. 1995),521-524.

Lee, C., et al., "Self-Assembly of Metal Nanocrystals on Ultrathin Oxide for Nonvolatile Memory Applications", *J. Elect. Mater*; vol. 34(1), (Jan. 2005), 1-11.

Liu, Z., et al., "Metal Nanocrystal Memories- Part I: Device Design and Fabrication", *IEEE Trans. Elect. Dev*; vol. 49(9), (Sep. 2002), 1606-1613.

Reidy, S., et al., "Comparison of two surface preparations used in the homoepitaxial growth of silicon films by plasma enhanced chemical vapor deposition", *J. Vac. Sci. Technol. B 21*(3), (May/June), 970-974.

Rhee, H. S, et al., "Cobalt Metallorganic Chemical Vapor Deposition and Formation of Epitaxial CoSl2 Layer on Si(100) Substrate", *Journal of Electrochemical Society*,146(6), (1999), 2720-2724.

Lee, C., et al., "Operational and Reliability Comparison of Discrete-Storage Nonvolatile Memories: Advantages of Single- and Double-Layer Metal Nanocrystals", *IEDM '03 Technical Digest. IEEE International Electron Devices Meeting*, (2003), 22.6.1-22.6.4.

* cited by examiner

DIELECTRIC BARRIER FOR NANOCRYSTALS

TECHNICAL FIELD

Embodiments of the invention relate generally to electronic apparatus and systems, and more particularly, to semiconductor devices and fabrication.

BACKGROUND

The electronics industry has a market driven need to reduce the size of devices such as transistors and higher level devices. A goal is to fabricate increasingly smaller and more reliable integrated circuits (ICs) for use in products such as processor chips, mobile telephones, and memory devices. Enhanced device structures and methods of fabricating such structures are needed to advance the functionality and/or operational capacity of electronic apparatus and systems.

DETAILED DESCRIPTION

The following detailed description refers to the accompanying drawings that show, by way of illustration, details and embodiments in which the invention may be practiced. These embodiments are described in sufficient detail to enable those skilled in the art to practice embodiments of the present invention. Other embodiments may be utilized and structural, logical, and electrical changes may be made without departing from the scope of the inventive subject matter. The various embodiments disclosed herein are not necessarily mutually exclusive, as some embodiments can be combined with one or more other embodiments to form new embodiments. The following detailed description is, therefore, not to be taken in a limiting sense.

Figure 1:
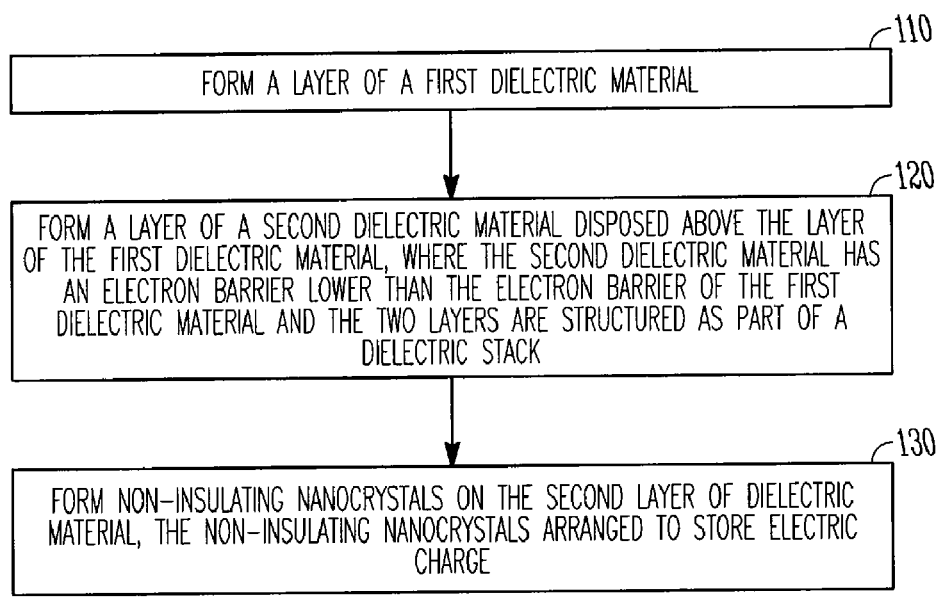
FIG. 1 shows features of an embodiment of a method of forming nanocrystals on a dielectric stack.

FIG. 1 shows features of an embodiment of a method of forming nanocrystals on a dielectric stack. At 110, a layer of a first dielectric material is formed. The first dielectric material may include a low-κ material such as silicon oxide. Herein, a low-κ material is a material having a dielectric constant (κ) less than 5 and a high-κ material is a material having a dielectric constant greater than or equal to 5. Silicon dioxide, for example, has a dielectric constant of about 3.9. The silicon oxide used as the first dielectric material may be formed as $SiO_2$ on a channel of a transistor having a floating gate.

At 120, a layer of a second dielectric material is formed above the layer of the first dielectric material, where the second dielectric material has an electron barrier lower than the electron barrier of the first dielectric material. Herein, an electron barrier of a dielectric material is the energy needed to transfer an electron from the conduction band edge ($E_c$) of a non-insulating material adjacent to the dielectric material to the conduction state of the dielectric material. For dielectric materials in a dielectric stack, the electron barrier may be independently referenced to the non-insulating material on which the dielectric stack is located. Materials to form the first dielectric material and the second dielectric material may be selected such that the electron barrier of the first dielectric material differs from the electron barrier of the second dielectric material by an energy difference having a magnitude in the range of between 0.5 eV and 3.0 eV. In an embodiment, the selected dielectric materials may have a energy barrier difference of magnitude in the range from about 1.0 eV to about 2.0 eV. The two layers may be structured as part of a dielectric stack. The dielectric stack may be structured essentially as the two layers. The dielectric stack may be structured as a tri-layer stack. The dielectric stack may be structured as a nanolaminate stack having more than three layers arranged such that the dielectric stack may be used as a tunneling dielectric in electronic devices. Such electronic devices include, but are not limited to, transistors and flash memories. A high-κ dielectric material, such as hafnium oxide, may be formed as the dielectric material having the lower electron barrier with silicon oxide as the dielectric material having the higher electron barrier. Other high-κ dielectric materials may be constructed in a dielectric stack with silicon oxide including, but not limited to, zirconium oxide, silicon oxynitrides, silicon nitride, aluminum oxide, titanium oxide, tantalum oxide, and lanthanide oxide, where lanthanide refers to any of the lanthanide group of metals.

At 130, non-insulating nanocrystals are formed on the second layer of dielectric material, where the non-insulating nanocrystals are arranged to store electric charge. Nanocrystals may include from a few hundred to tens of thousands of atoms that combine into a crystalline form of matter known as a "cluster." Nanocrystals around ten nanometers in diameter are typically larger than molecules but smaller than bulk solids. Nanocrystals may exhibit physical and chemical properties somewhere in between that expected of molecules and that expected of bulk solids. When a nanocrystal is structured essentially as a surface with no interior, its properties may vary as the crystal grows in size. In an embodiment, nanocrystals are formed having an effective diameter of less than or equal to 10 nanometers and are spaced apart from each other by one nanometer or more to define a charge storage region of an electronic device. The non-insulating nanocrystals may include, but are not limited to, ruthenium nanocrystals, platinum nanocrystals, tungsten nanocrystals, iridium nanocrystals, osmium nanocrystals, nickel nanocrystals, cobalt nanocrystals, gold nanocrystals, silver nanocrystals, semiconductor nanocrystals, conductive metal nitride nanocrystals, conductive metal oxide nanocrystals such as iridium oxide nanocrystals and ruthenium oxide nanocrystals, and combinations thereof. The non-insulating nanocrystals may be formed by various techniques including, but not limited to, chemical vapor deposition and atomic layer deposition. The material composition for the first dielectric material, the second dielectric material, and the non-insulating nanocrystals may be selected to structure the second dielectric material as a diffusion barrier between the non-insulating nanocrystals and the first dielectric material. The dielectric stack may be configured to allow tunneling of electrons from a region on which the dielectric stack is disposed to the non-insulating nanocrystals. The non-insulating nanocrystals may be formed as a charge storage region in a flash memory.

Metal nanocrystals are promising materials as successor materials for a traditional poly-Si floating gate. Metal nanocrystals may allow for reduction of parasitic capacitive coupling effects as well as stress-induced gate leakage, which leads to larger read window budget. In an embodiment, a memory system includes a metal nanocrystal charge storage region and an engineered tunnel dielectric within a dielectric stack. The engineered tunnel dielectric may be structured to prevent reaction of a metal nanocrystal with an underlying $SiO_2$-based tunnel oxide and, at the same time, to improve data retention in the memory. In an embodiment, a bi-layer stack may be composed of conventional "high electron barrier" $SiO_2$ layer and a "lower electron barrier" dielectric layer such as $Si_3N_4$ and $HfO_2$, where the "lower electron barrier" layers may also serve to prevent diffusion and reaction of the metal from a metal nanocrystal storage region with the underlying $SiO_2$-based tunnel oxide. The dielectric stack may include three layers or more layers.

Using a bi-layer dielectric stack in which one layer is a silicon dioxide layer and the other layer is a high-κ material allows the dielectric stack to have an equivalent oxide thickness that is small than a silicon oxide layer of the same physical thickness as the dielectric stack. Alternatively, such a bi-layer dielectric stack can be made physically larger than a silicon oxide layer and have the same equivalent oxide thickness. The equivalent oxide thickness quantifies the electrical properties, such as capacitance, of a dielectric in terms of a representative physical thickness. The equivalent oxide thickness is defined as the thickness of a theoretical $SiO_2$ layer that would be required to have the same capacitance density as a given dielectric, ignoring leakage current and reliability considerations.

Figure 2A:
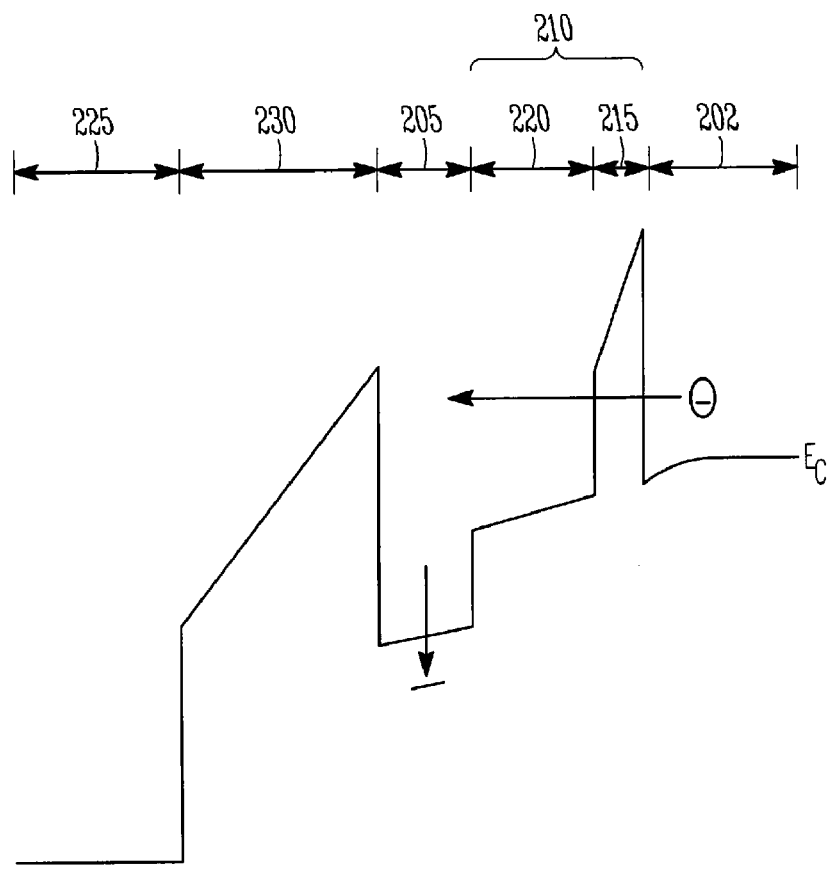
FIGS. 2A-2B show band diagrams illustrating an embodiment of a flash memory cell in a write mode and in a retention mode, where the memory cell has a nanocrystal charge storage region and a bi-layer dielectric stack on a silicon substrate.
Figure 2B:
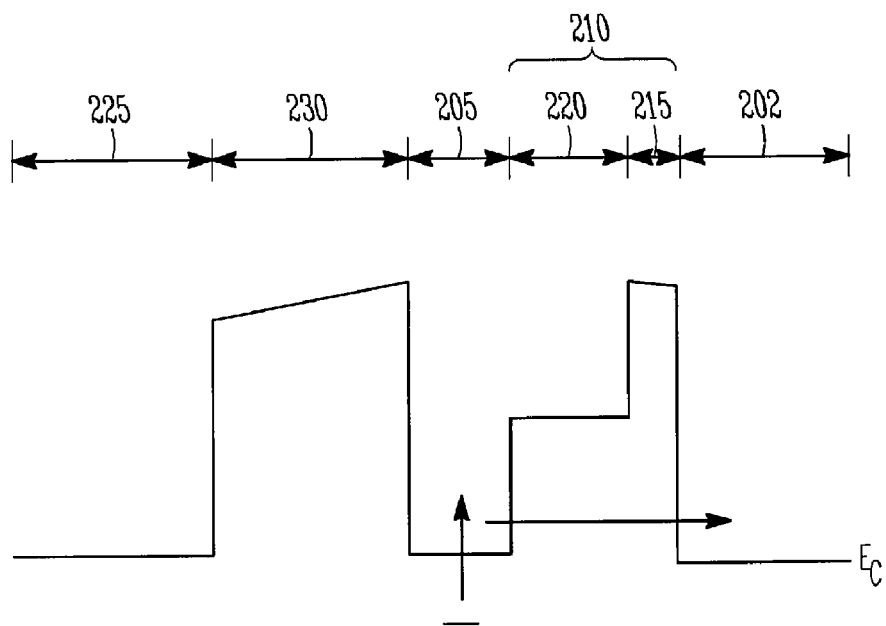

FIGS. 2A-2B show band diagrams illustrating an embodiment of a flash memory cell in a write mode and in a retention mode, where the memory cell has a nanocrystal charge storage region 205 and a bi-layer dielectric stack 210 on a silicon substrate 202. Bi-layer dielectric stack 210 includes a dielectric layer 215, such as a silicon oxide layer 215, and a dielectric layer 220, where dielectric layer 220 has a lower electron barrier than silicon oxide layer 215. Dielectric layer 220 may be $Si_3N_4$. Dielectric layer 220 may be $HfO_2$. Dielectric layer 220 may be a high-κ dielectric layer. A low-κ dielectric that has an electron barrier less than that of silicon oxide may be used as dielectric layer 220 in dielectric stack 210. The activation of the memory mode may be regulated by a control gate 225 that is separated from the nanocrystal charge storage region 205 by an insulating layer 230.

FIG. 2A shows the program mode in which a bias is applied, where the band structure acts as a staircase barrier in which tunneling is from the substrate 202 through the bi-layer dielectric stack 210 into the memory material 205, which are the non-insulating nanocrystals. With the energy barrier of the silicon oxide layer 215 being higher than that of dielectric layer 220, the energy barrier of the silicon oxide is the controlling barrier in the write mode. Use of the bi-layer allows using a thinner silicon oxide tunnel barrier that allows for faster write speed.

FIG. 2B shows the data retention mode, when there is no applied bias. In the retention mode, the controlling barrier for tunneling is the complete dielectric stack 210 such that the barrier to tunneling is effectively a thicker barrier relative to the barrier in write mode. Thus, for a given equivalent oxide thickness, the bi-layer dielectric stack barrier allows faster write speed without any penalty of data retention. The bi-layer dielectric stack also provides improved data retention without program voltage penalty.

In an embodiment, selection of the material to form layer 220 may also be conducted to provide improved thermal stability against metal nanocrystal—silicon oxide reaction at elevated processing temperatures. With dielectric stack 210 constructed with dielectrics other than silicon oxide, dielectric layers for layers 215 and 220 may be chosen such that electron barrier of layer 215 is higher than the electron barrier of layer 220 and the material of layer 220 acts as a diffusion barrier to the diffusion of elements of non-insulating nanocrystals 205 to dielectric layer 215.

Thermal instability of metal nanocrystals on thin tunnel oxides such as $SiO_2$ having a thickness less than 6 nm may occur for high work function elements that are fast diffusers through $SiO_2$. At elevated temperatures for source/drain activation (950° C. spike), there may be significant diffusion of metal across the $SiO_2$ tunnel oxide as well as reaction between metal and the tunnel oxide, both of which leads to degraded device performance, such as degraded data retention capability and minority carrier lifetime. Certain high-κ materials, such as, but not limited to, SiON, $Si_3N_4$, $Al_2O_3$, and $HfO_2$, are known to provide good diffusion barrier characteristics against metals at elevated temperatures. For example, a metal oxide semiconductor (MOS) configuration of a Ru metal/dielectric layer/Si substrate in which the dielectric includes $HfO_2$ on top of $SiO_2$ that contacts the silicon substrate enables an effective suppression of Ru metal interacting with underlying $SiO_2$ and Si substrate. Ruthenium metal may be used as a metal nanocrystal configured as a charge storage element to replace a conventional floating gate. Other metals that may be configured as nanocrystals to store charge may include, but are not limited to, platinum, tungsten, iridium, osmium, nickel, cobalt, gold, and silver. Other non-insulating materials that may be configured as nanocrystals to store charge may include, but are not limited to, semiconductors, conductive metal nitrides, and conductive metal oxides such as iridium oxide and ruthenium oxide. Non-insulating materials that may be configured as nanocrystals to store charge may include, but are not limited to, combinations of metals, semiconductors, conductive metal nitrides, and conductive metal oxides. Silicon may be used as nanocrystals. However, non-insulating materials other than silicon may be used to enhance the memory window and increase nanocrystal density, both of which may lead to further technology extendability and scalability. For example, metal nanocrystals may enable flash (NAND) scaling beyond the 50 nm node.

Figure 3:
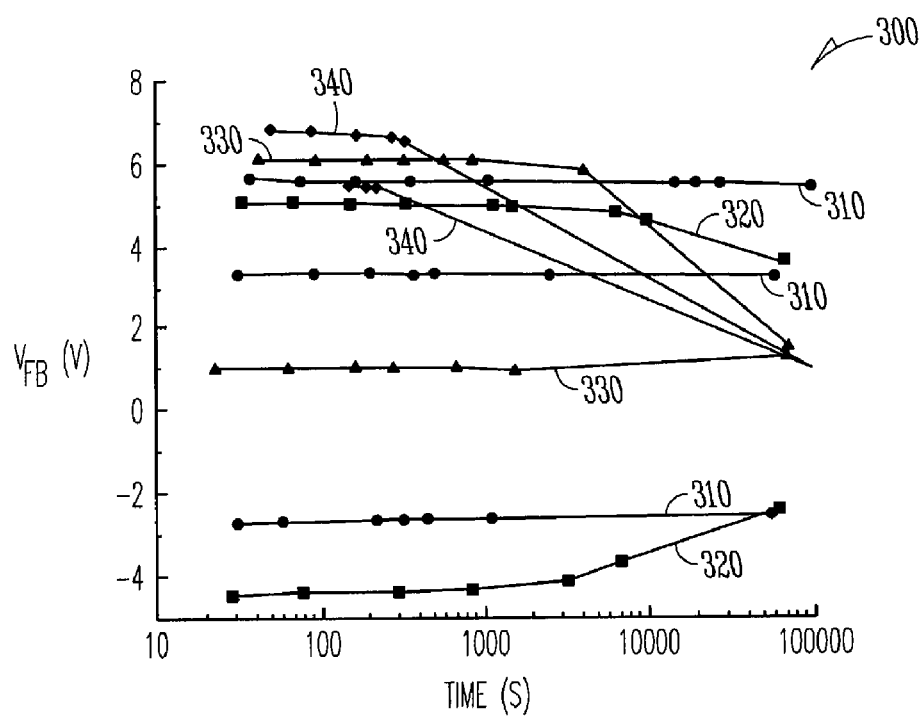
FIG. 3 shows a graph illustrating data retention results from applications of writing to several memory structures, including embodiments with a bi-layer dielectric stack.

FIG. 3 shows a graph 300 illustrating data retention results from applications of writing to several memory structures, including embodiments with a bi-layer dielectric stack. Graph 300 shows the flat-band voltage, $V_{FB}$, over time after a memory is placed in retention mode following write operations for each of four structures. Curves 310 show retention data for a structure having an electrode metal/$Al_2O_3$/n-type Pt nanocrystals/2 nm $HfO_2$ layer/tunnel $SiO_2$ layer/Si substrate. Curves 320 show retention data for a structure having an electrode metal/$Al_2O_3$/n-type Pt nanocrystals processed at 950° C./tunnel $SiO_2$ layer/Si substrate. Curves 330 shows retention data for a structure having an electrode metal/$Al_2O_3$/n-type Pt nanocrystals/tunnel $SiO_2$ layer/Si substrate. Curves 340 shows retention data for a structure having an electrode metal/$Al_2O_3$/p-type Pt nanocrystals/tunnel $SiO_2$ layer/Si substrate. The data of graph 300 illustrates improved data retention characteristics as a result of inclusion of an ultra-thin (~2 nm) HfO$_2$ between a layer of Pt nanocrystals and the underlying SiO$_2$. A layer of non-insulating nanocrystals, such as metal nanocrystals, may be integrated into a memory structure that is processed at elevated temperatures that is compatible with conventional complimentary metal oxide semiconductor (CMOS) processes without performance degradation due to adverse reaction between the layer of non-insulating nanocrystals charge storage compounds and its surroundings.

In various embodiments, an engineered tunnel barrier structure for a nanocrystal-based flash memory provides improved data retention and thermal stability. The engineered tunnel barrier structure, providing a diffusion barrier and enhanced operational storage and charge retention, may be used in a variety of non-volatile memories. The materials for the nanocrystals and engineered tunnel barrier structures may be selected to provide an appropriate diffusion barrier to the selected nanocrystals. The materials for the nanocrystals and engineered tunnel barrier structures may be selected to provide an appropriate energy barrier differential between the layers of the engineered tunnel barrier structure.

Figure 4:
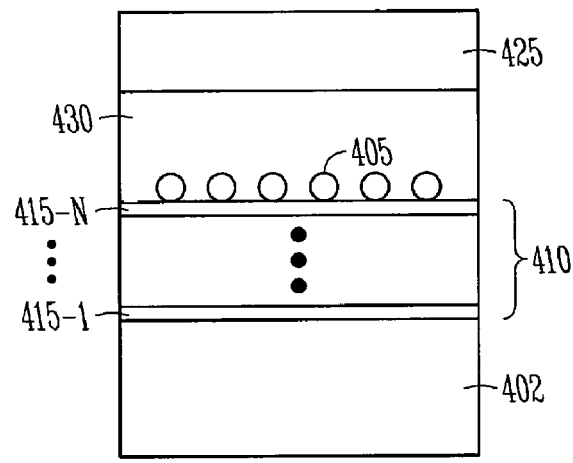
FIG. 4 depicts an embodiment of a structure having a layer of nanocrystals to store charge, where the layer of nanocrystals is disposed on a dielectric stack having multiple dielectric layers.

FIG. 4 depicts an embodiment of a structure 400 having a layer of nanocrystals 405 to store charge, where the layer of nanocrystals 405 is disposed on a dielectric stack 410 having multiple dielectric layers 415-1 . . . 415-N. Nanocrystals 405 may be formed using one or more processing techniques. The material for nanocrystals 405 may be deposited and thermally annealed. The size and spacing may be controlled by the amount of material deposited, the substrate temperature during deposition, the anneal temperature, and other parameters to tune the size and inter-particle separation in the dispersion of the nanocrystals. Nanocrystals 405 may be formed as non-insulating nanocrystals having a relatively constant separation between nanocrystals. The separation distance may be about 1 nm. The separation distance may be greater than 1 nm. The separation between nanocrystals may vary providing an average separation. The average separation may be about 1 nm or greater than 1 nm. The nanocrystals may be separated by less than 1 nm but at a distance such that the nanocrystals remain separate and do not form a bulk-like structure. The nanocrystals may have a diameter of less than 10 mm. The nanocrystals may have a diameter of about 10 nm. Nanocrystals in various embodiments are not limited to the above example diameters and separation distances. The composition of nanocrystals 405 may include, but is not limited to, ruthenium, platinum, tungsten, iridium, osmium, nickel, cobalt, gold, silver, semiconductors, conductive metal nitrides, conductive metal oxides, and combinations thereof.

Dielectric layers 415-1 . . . 415-N may be configured and materials selected for these layers such that one or more layers provide a diffusion barrier to the components of nanocrystals 405 to the diffusion of these components to underlying dielectric layers in dielectric stack 410 and to substrate 402. Layer 415-N may be inert relative to the compositional elements of nanocrystals 405.

The configuration and materials for dielectric layers 415-1 . . . 415-N may be selected to provide energy barriers such that at least one energy barrier for one of the dielectric layers 415-1 . . . 415-N is smaller in magnitude than the other energy barriers. Dielectric layers 415-1 . . . 415-N may be arranged such that the largest energy barrier is provided by dielectric layers 415-1 and the smallest energy barrier is provided by 415-N that contacts nanocrystals 405. In an embodiment, a tri-layer dielectric stack 410 may be structured to provide a low energy barrier/high energy barrier/low energy barrier structure between nanocrystals 405 and substrate 402.

Differences in energy barriers to the flow of charge that are provided by different dielectric materials may be correlated to band offsets relative to the conduction band edge of the dielectric materials. In an embodiment, the energy offset between dielectric layers 415-1 . . . 415-N may be on the order of 1 to 2 EV. In an embodiment, the energy offset between dielectric layers 415-1 . . . 415-N may be on the order of 0.5 to 3 EV. The order of the materials constructed in dielectric layers 415-1 . . . 415-N may be arranged to provide the fastest write times with a retention time that meets a desired threshold time. The order of the materials constructed in dielectric layers 415-1 . . . 415-N may be arranged to provide the longest retention time with write times that meet a desired threshold time. A retention threshold time may be set as a time at which a flat-band voltage remains within a fixed percentage of a value following a write operation. Dielectric stack 410 may be a bi-layer stack, a tri-layer stack, or a stack having more than three layers.

Dielectric stack 410 may be configured to have a gradual composition change to provide a one-sided triangle type of band offset across dielectric stack 410 with the highest energy at the interface of dielectric layer 415-1 and substrate 402. The gradual composition change may be provided by having the concentration of the elements in the oxide being non-uniform. For example, an initial aluminum oxide may be formed and, during processing, the processed surface may be half saturated with an aluminum precursor and half saturated with a hafnium precursor to form an aluminum hafnium oxide. By continuously varying the aluminum/hafnium ratio, a graded composition may result in a graded energy band from substrate 402 to nanocrystals 405.

The thickness of dielectric stack 410 may be selected to provide charge transfer from underlying substrate 402 to nanocrystals 405. In an embodiment, dielectric stack 410 may be a bi-layer stack in which layer 415-2 is a high-κ dielectric material, such as but not limited to hafnium oxide, having a thickness of less than 5 nm, and layer 415-1 is silicon oxide having a thickness less than 8 nm. Other thicknesses and dielectric materials may be used.

Structure 400 may include a conductive control layer 425 to regulate charge transfer from substrate 402 to nanocrystals 405. Conductive control layer 425 may be separated from nanocrystals 405 by insulating layer 430. Insulating layer 430 may be a silicon oxide layer. Insulating layer 430 may be a layer of a high-κK material, such as but not limited to hafnium oxide, aluminum oxide, silicon nitride, silicon oxynitride, and/or a metal-silicon oxynitride. Insulating layer 430 may be a layer of various combinations of silicon oxide and high-κ material. In an embodiment, insulating layer 430 is separated from nanocrystals 405 by dielectric layer 415-N that is conformably wrapped around each nanocrystal 405. In an embodiment, the combination of insulating layer 430 and dielectric stack 410 has a total equivalent oxide thickness of 20 nm. In an embodiment, the combination of insulating layer 430 and dielectric stack 410 has a total equivalent oxide thickness less than 20 nm. However, for some applications the combination of insulating layer 430 and dielectric stack 410 may have a total equivalent oxide thickness larger than 20 nm.

In various embodiments, structure 400 may be operated to control charge transfer from substrate 402 to nanocrystals 405 using applied voltages that fall within the operational regime of non-volatile memory. The programming of structure 400 may use operational voltages including 15-25 volts. In an embodiment, structure 400 provides for operation of a memory with a lowered program voltage compared to memory having an equivalent silicon dioxide layer in place of dielectric stack 410.

Figure 5:
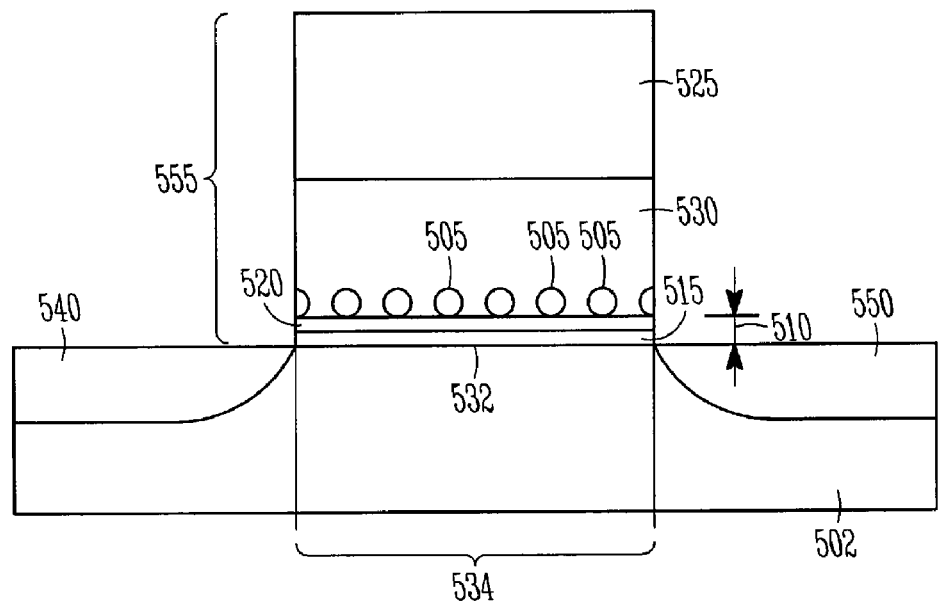
FIG. 5 shows a representation of an embodiment of a configuration of a transistor having isolated non-insulating nanocrystals as charge storage elements on a dielectric stack.

FIG. 5 shows a representation of an embodiment of a configuration of a transistor 500 having isolated non-insulating nanocrystals 505 as charge storage elements. Transistor 500 includes a silicon based substrate 502 with a source 540 and a drain 550 separated by a body region 532. However, transistor 500 is not limited to silicon based substrates, but may be used with a variety of semiconductor and insulating substrates. Body region 532 between source 540 and drain 550 defines a channel region having a channel length 534. Located above body region 532 is a charge storage control stack 555 including a dielectric stack 510, non-insulating nanocrystals 505 to store charge, an insulating layer 530, and a control gate 525. Dielectric stack 510 includes dielectric layer 515 and dielectric layer 520, where dielectric layer 515 has an energy barrier that is larger than the energy barrier of dielectric layer 520. Dielectric layer 520 may be structured as a diffusion barrier inhibiting migration of compositional elements of non-insulating nanocrystals to dielectric layer 515 or substrate 502. An interfacial layer may form between body region 532 and dielectric stack 510. In an embodiment, an interfacial layer may be eliminated, limited to a relatively small thickness compared to dielectric stack 510, or limited to a thickness significantly less than dielectric stack 510 as to be effectively eliminated.

Non-insulating nanocrystals 505 may be structured as a layer of spaced-apart non-insulating nanocrystals 505. Alternatively, non-insulating nanocrystals 505 may be structured as a number of layers of spaced-apart non-insulating nanocrystals. In an embodiment, the number of layers or the thickness of the film of isolated non-insulating nanocrystals is selected to provide charge trapping to the various levels of non-insulating nanocrystals by a tunneling mechanism. Such a thickness or distance from body region 532 may be dependent on the application. Non-insulating nanocrystals 505 may have a composition including, but not limited to, ruthenium, platinum, tungsten, iridium, osmium, nickel, cobalt, gold, silver, semiconductors, conductive metal nitrides, conductive metal oxides, and combinations thereof.

Dielectric stack 510 may include a silicon oxide layer 515 and a hafnium oxide layer 520. Dielectric layer 520 may include high-K material other than hafnium oxide. Dielectric layer 515 may be formed of a dielectric material other than silicon oxide. Dielectric stack 510 may be constructed according to various embodiments as taught herein. Further, the composition of non-insulating nanocrystals 505 and dielectric stack 510 may be selected in accordance with various embodiments as taught herein to mate to substrate 502 that is formed of a material other than silicon. In various embodiments, silicon, germanium, gallium arsenide, silicon-on-sapphire, silicon oxide, amorphous aluminum oxide, sapphire, or other suitable substrates may be used.

Transistor 500 or other devices including a charge storage element using non-insulating nanocrystals on a dielectric stack, in accordance with embodiments taught herein, may be used in a variety of electronic apparatus. Such apparatus include, but are not limited to, mobile information handling devices, mobile wireless devices, electro-optic devices, and imaging devices.

Figure 6:
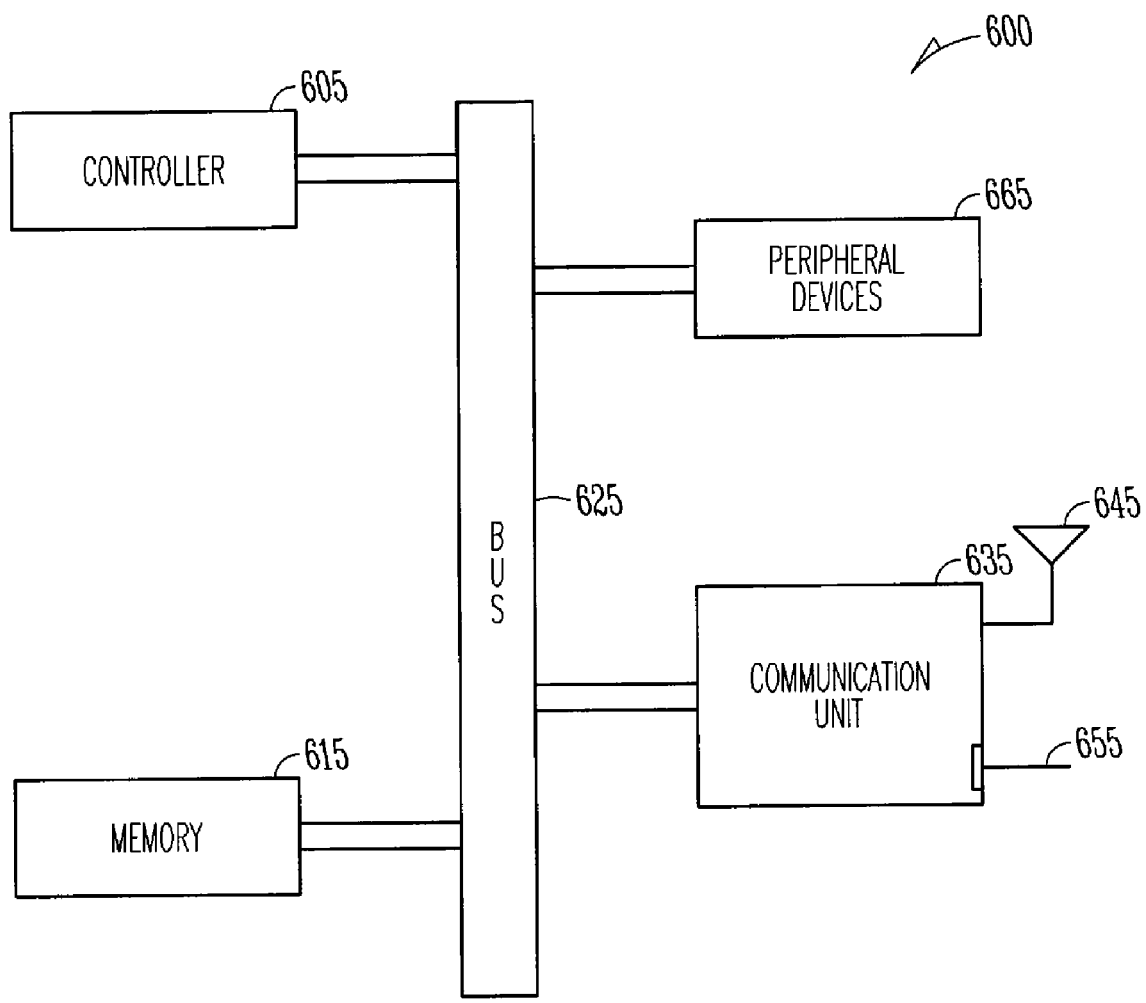
FIG. 6 illustrates a block diagram of an embodiment of a system having a charge storage element structured as a nanocrystal charge storage region on a dielectric stack.

FIG. 6 illustrates a block diagram of an embodiment of a system 600 having a component with a charge storage element structured as non-insulating nanocrystals disposed on a dielectric stack, in accordance with embodiments as taught herein. System 600 may include a controller 605, a memory 615, and a bus 625, where bus 625 provides electrical connectivity between controller 605 and memory 615 and between controller 605 and a communication unit 635. Bus 625 may be a parallel bus. Bus 625 may be a serial bus. Communication unit 635 may include a communications interface to communicate externally from system 600. Communication unit 635 may include a transmitter for bi-directional communication over a network. Communication unit 635 may couple to a wired network or a wireless network. Alternatively, communication unit 635 may include a network interface to couple to a wired network and to a wireless network. A wired network may include a network having wire channels, fiber optic channels, and/or co-axial channels.

In various embodiments, peripheral devices 665 may include displays, additional storage memory, or other control devices that may operate in conjunction with controller 605. Alternatively, peripheral devices 665 may include displays, imaging devices, additional storage memory, or other control devices that may operate in conjunction with controller 605, communication unit 635, and/or memory 615. Peripheral device or devices 665 may be coupled to bus 625. Bus 625 may be compatible with peripheral component interconnect (PCI) or with PCI Express. In an embodiment, communication unit 635 may include a network interface card. In an embodiment, communication unit 635 may include a communications device suitable for use with a 10GBase-T device. Communication unit 635 may include a connection to a wired network. The connection to the wired network may be configured to connect to a cable 655. The connection may be configured to connect to an unshielded twisted pair cable. The connection may be configured to connect to a shielded twisted pair cable. In an embodiment, communication unit 635 may be coupled to an antenna 645. In an embodiment, antenna 645 may be a substantially omnidirectional antenna.

In an embodiment, controller 605 may be a processor. Memory 615 may include any form of computer-readable medium that has computer-executable instructions that may provide control of one or more elements of system 600. In an embodiment, memory 615 may be realized as a memory device containing a storage element structured as non-insulating nanocrystals disposed on a dielectric stack in accordance with embodiments as taught herein. In an embodiment, a storage element structured as non-insulating nanocrystals disposed on a dielectric stack may be disposed in a memory cell of a memory array. In an embodiment, such a structure may be formed in a transistor in a memory cell of a memory array. Various embodiments are applicable to any size and type of memory circuit and are not intended to be limited to a particular type of memory device. System 600 may include, but is not limited to, information handling systems, wireless systems, telecommunication systems, fiber optic systems, electro-optic systems, computers and imaging systems.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An apparatus comprising:
   a substrate;
   a dielectric stack formed over the substrate, the dielectric stack including a first dielectric material with a first element and a second dielectric material with a second element; and a non-insulating nanocrystal disposed on the second dielectric material, the non-insulating nanocrystal to store electric charge, wherein the first dielectric material and the second dielectric material are configured to have a gradual composition change to provide a one-sided triangle type of band offset across the first dielectric material and the second dielectric material of the dielectric stack with a highest energy at an interface of the first dielectric material and the substrate such that concentrations of the first and second elements continuously vary to result in a graded composition with a graded energy band from the substrate to the non-insulating nanocrystal.

2. The apparatus of claim 1, wherein the second dielectric material includes dielectric material structured as a diffusion barrier between the non-insulating nanocrystal and the first dielectric material.

3. The apparatus of claim 1, wherein the second dielectric material includes hafnium oxide and the first dielectric material includes silicon oxide.

4. The apparatus of claim 1, wherein the second dielectric material includes a high-κ dielectric material and the first dielectric material includes silicon oxide.

5. The apparatus of claim 1, wherein the non-insulating nanocrystal is one of a set of spaced apart non-insulating nanocrystals, the spaced apart non-insulating nanocrystals including ruthenium nanocrystals.

6. The apparatus of claim 1, wherein the non-insulating nanocrystal is one of a set of spaced apart non-insulating nanocrystals, the spaced apart non-insulating nanocrystals including platinum nanocrystals.

7. The apparatus of claim 1, wherein the non-insulating nanocrystal is one of a set of spaced apart non-insulating nanocrystals, the spaced apart non-insulating nanocrystals including conductive metal oxides.

8. The apparatus of claim 1, wherein the non-insulating nanocrystal is one of a set of spaced apart non-insulating nanocrystals, the spaced apart non-insulating nanocrystals including conductive metal nitrides.

9. The apparatus of claim 1, wherein the non-insulating nanocrystal is one of a set of spaced apart non-insulating nanocrystals, the spaced apart non-insulating nanocrystals including semiconductor nanocrystals.

10. The apparatus of claim 1, wherein the dielectric stack includes a dielectric layer in addition to the first dielectric material and the second dielectric material.

11. The apparatus of claim 1, wherein the apparatus includes:
an insulating layer disposed on the non-insulating nanocrystals; and
a conductive control layer disposed on the insulating layer.

12. The apparatus of claim 1, wherein the apparatus includes a memory having the non-insulating nanocrystal as a storage region of the memory.

13. The apparatus of claim 12, wherein the memory is a flash memory.

14. The apparatus of claim 1, wherein the apparatus includes a wireless device.

15. A method comprising:
forming a dielectric stack over a substrate, the dielectric stack including a first dielectric material with a first element and a second dielectric material with a second element; and
forming a non-insulating nanocrystal disposed on the second dielectric material, the non-insulating nanocrystal to store electric charge, wherein the first dielectric material and the second dielectric material are configured to have a gradual composition change to provide a one-sided triangle type of band offset across the first dielectric material and the second dielectric material of the dielectric stack with a highest energy at an interface of the first dielectric material and the substrate such that concentrations of the first and second elements continuously vary to result in a graded composition with a graded energy band from the substrate to the non-insulating nanocrystal.

16. The method of claim 15, wherein forming the non-insulating nanocrystal includes forming non-insulating nanocrystals by chemical vapor deposition.

17. The method of claim 15, wherein forming the non-insulating nanocrystal includes forming non-insulating nanocrystals by atomic layer deposition.

18. The method of claim 15, wherein forming a first dielectric material and forming a second dielectric material include forming the first dielectric material and the second dielectric material such that the electron barrier of the first dielectric material differs from the electron barrier of the second dielectric material by an energy having a magnitude in the range of between 0.5 eV and 3.0 eV.

19. The method of claim 15, wherein the method includes forming the second dielectric material as a diffusion barrier between the non-insulating nanocrystal and the first dielectric material.

20. The method of claim 15, wherein forming a first dielectric material includes forming a layer of silicon oxide and forming a second dielectric material includes forming a layer of hafnium oxide.

21. The method of claim 15, wherein the method includes forming the non-insulating nanocrystal as a charge storage region in a flash memory.

* * * * *